United States Patent [19]

Montean

[11] Patent Number: 4,745,401

[45] Date of Patent: May 17, 1988

[54] RF REACTIVATABLE MARKER FOR ELECTRONIC ARTICLE SURVEILLANCE SYSTEM

[75] Inventor: Samuel Montean, Blaine, Minn.

[73] Assignee: Minnesota Mining and Manufacturing Company, St. Paul, Minn.

[21] Appl. No.: 773,593

[22] Filed: Sep. 9, 1985

[51] Int. Cl.⁴ .............................................. G08B 13/18
[52] U.S. Cl. ........................................ 340/572; 343/188;
 343/895; 333/175; 333/185; 342/51
[58] Field of Search ....................... 343/787, 788, 895;
 333/185, 175; 340/572, 552, 553; 342/27, 42,
 51; 336/200, 232

[56] References Cited

U.S. PATENT DOCUMENTS

| | | | |
|---|---|---|---|
| 3,493,955 | 2/1970 | Minasy | 340/572 |
| 3,631,442 | 12/1971 | Fearon | 343/787 X |
| 3,665,449 | 5/1972 | Elder et al. | 340/572 |
| 3,747,086 | 7/1973 | Peterson | 343/787 X |
| 3,790,945 | 2/1974 | Fearon | 343/787 X |
| 3,810,147 | 5/1974 | Lichtblau | 340/572 |
| 4,151,405 | 4/1979 | Peterson | 343/787 X |
| 4,598,276 | 7/1986 | Tait | 333/185 X |
| 4,658,263 | 4/1987 | Urbanski | 340/572 X |

FOREIGN PATENT DOCUMENTS

| | | |
|---|---|---|
| 2119603 | 11/1983 | United Kingdom . |
| 2121652 | 12/1983 | United Kingdom . |
| 2148668 | 5/1985 | United Kingdom ............... 340/572 |

OTHER PUBLICATIONS

Snyder, Albers–Schoenberg, and Goldsmith; "Magnetic Ferrites-Core Materials for High Frequencies"; *Electrical Manufacturing;* Dec. 1949 Issue; pp. 86–91.

Primary Examiner—Eugene R. LaRoche
Assistant Examiner—Benny T. Lee
Attorney, Agent, or Firm—Donald M. Sell; James A. Smith; William B. Barte

[57] ABSTRACT

A marker for use in radio frequency electronic article surveillance systems where the marker contains an inductive-capacitive resonant circuit and is made reversibly deactivatable and reactivatable by the addition of a piece of magnetic material and means, such as a piece of permanently magnetizable material, for biasing the first material to prevent alternating fields induced therein from changing the magnetic state of that material, thereby preventing hysteresis losses from causing a lowering of the Q of the resonant circuit below the point of detection.

16 Claims, 5 Drawing Sheets

RF REACTIVATABLE MARKER FOR ELECTRONIC ARTICLE SURVEILLANCE SYSTEM

FIELD OF THE INVENTION

This invention relates to electronic article surveillance systems of the type in which a marker containing an inductive-capacitive circuit resonant at at least one frequency, is utilized in conjunction with radio frequency electromagnetic fields operating in tne range or the resonant frequency in order to cause oscillations in the circuit which are remotely detected. Such systems are particularly used to thwart shoplifting and to otherwise detect the passage of controlled objects through a surveillance zone.

BACKGROUND OF THE INVENTION

In surveillance systems of the type referred to above, the markers have generally been single status, i.e., they have not been able to be reused, i.e., repeatedly, deactivated and subsequently reactivated. Such a limitation has, for the most part, restricted the use of such systems to applications in which the marker is physically removed from the object when detection thereof is no longer desired, such as at the point of sale. It has also been proposed to physically and irreparably destroy or alter the resonant circuit within the marker, such as by a fusible link which is melted so as to open a portion of the circuit. (See Lichtblau, U.S. Pat. No. 3,810,147). Such a scheme has not found commercial acceptability, possibly due to the expense of the markers, which become useless after the circuit is thus irreparably destroyed or altered.

As the resonant circuits used in the markers are readily affected by a conductive sheet placed in close proximity, it is also known to selectively deactivate such markers by positioning such a sheet i.e., an aluminum foil, next to the marker. For example, such a marker could be concealed within the UPC label or beneath the pocket in a library book into which a "check-out" card is to be inserted. A conductive foil concealed within the check-out card or within a separate paste-on label would then be provided. Obviously, that scheme requires separate deactivatable components, and may be impractical for use in many situations.

One suggestion for providing a deactivatable/reactivatable RF marker is set forth in U.S. Pat. No. 3,493,955 (A. J. Minasy). In that patent, it is proposed that a small, non-conductive but magnetizable element such as a ferrite can be positioned on or close to a coil in the marker. It is stated in that patent that normally the ferrite will be in its non-magnetic state and will have no effect on the operation of the marker, but that when it is desired to deactivate the marker, the ferrite be brought to its magnetic state, thereby interfering with the electromagnetic fields of radio waves in the vicinity, and hence effectively preventing operation of the device. A large electromagnet is proposed to be used to switch the ferrite back and forth between its magnetic and non-magnetic state. Such a concept is not known to have ever been successfully utilized.

U.S. Pat. No. 4,063,229 (Welsh et al) depicts yet another type of EAS system wherein a marker or tag containing an electrically non-linear element such as a diode is used to generate harmonics of a transmitted microwave signal, typically at 100 or 915 MHz. Harmonics, typically second order at 200 or 1830 MHz, are then detected. Such a marker does not have an intrinsic resonant frequency, and the diode is provided with an antenna tuned to the transmitted frequency to enhance the absorption of energy and the transmission of harmonic radiation. That patent (Col. 18, line 47ff, and FIGS. 10 and 11) also suggests that the tags can be made deactivatable by providing layers of two ferrites adjacent inner and outer antenna loops joined together via a non-linear capacitor such as a reverse biased diode. The first ferrite layer (407) is proposed to be a high retentivity, permanently magnetizable ferrite, while the second layer (408) is a soft low retentivity ferrite. The tag is said to be activatable by magnetically saturating the first layer. Flux from that layer returns through the second layer which is thereby also saturated, and the inductances of the antenna loops are, therefore, generally unaffected. To deactivate the tag, the first ferrite layer is demagnetized. The second layer then possesses high permeability and increases the inductance of the loops to about twice their former value, thus reducing the reaction fields below a detectable level.

FIGS. 15 and 16 and the accompanying description (Column 20, lines 12-24) of the Welsh '229 patent suggest a deactivatable tag in which a single tuned loop circuit is used which resonate at the fundamental system frequency, and in which no non-linear element is provided. First and second ferrite layers (407 and 408) are provided as in the embodiments shown in FIGS. 10 and 11. It is there suggested that such an embodiment could be employed in applications in which selectivity does not pose a problem because no articles are present which are sufficiently conductive to distort the applied fundamental frequency field through creation of eddy currents. Notwithstanding the reasonable commercial success enjoyed by such diode containing tags and associated systems transmitting at microwave frequencies, it is not believed that deactivatable tags as described in the '229 patent have ever been found to be practical.

In another, totally different, type of electronic article surveillance system, magnetically deactivatable and reactivatable markers have been successfully employed for a number of years. See, for example, U.S. Pat. No. 3,665,449, Elder & Wright. Such systems utilize a marker which is itself magnetic, comprising an elongated strip of low coercive force, high permeability ferromagnetic material, adjacent to which is positioned at least one piece of a higher coercive force, permanently magnetizable material. When the magnetization in such a strip is reversed by a low frequency alternating magnetic field produced in an interrogation zone, detectable harmonics of that frequency are generated. In direct opposite to that suggested by Welsh et al ('229), such a magnetic marker is deactivated by magnetizing the higher coercive force, permanently magnetizable material. The magnetized material magnetically biases the low coercive force material and prevents the magnetization therein from reversing due to the alternating field present in the interrogation zone, thus preventing its detection, i.e., deactivating it. The deactivatability thus provided has greatly contributed to the significant commercial success enjoyed by such systems over the past decade. The absence of a practical reversible-deactivation capability has, on the other hand, appreciably restricted the areas in which the other systems could be used and has thereby lessened the commercial success of such systems.

SUMMARY OF THE INVENTION

Despite the advantages presented by the magnetic deactivation/reactivation principles employed in systems such as disclosed in U.S. Pat. No. 3,665,449, and despite a long standing desire to provide deactivatable/reactivatable markers for use in RF EAS systems, the only previous suggestions of such an RF marker are those set forth in Minasy '955, and Welsh '229, and those suggestions have not proven to be feasible. In contrast, the present invention manifests, for the first time, just such a deactivable/reactivatable RF marker and indeed utilizes magnetic principles to accomplish that highly desirable result.

The marker of the present invention is, therefore, for use in an electronic article surveillance system having a receiver for detecting oscillations from a sharply tuned resonant circuit when the Q-factor associated therewith exceeds a predetermined value. The marker itself comprises such a resonant circuit, the circuit having a multi-turn inductive component and having a Q-factor greater than the predetermined value when in a sensitized state and less than the predetermined value when in a desensitized state. Typically, as is well known, such a circuit will also include a capacitive component in order to complete a circuit resonant at at least a given frequency. The marker further comprises at least one piece of magnetic material forming a magnetic circuit substantially enclosing at least a portion of the inductive component and means for controllably magnetically biasing the magnetic material. Preferably, the magnetic biasing means comprises a permanently magnetizable member. Removing the magnetic bias results in a reduction in the Q-factor below the predetermined value, and desensitizes the circuit.

In the present invention, it has been found that such a presence of the piece of magnetic material, by itself, causes the Q-factor to be decreased from that which would exist were no such material present, to a level at which the marker is nominally not detectable. Further, it has been found that when a non-varying magnetic field is impressed upon the magnetic material no appreciable reduction in the Q-factor is observed. Such a non-varying field is conveniently provided by positioning a piece of permanently magnetizable material adjacent the first material.

It is generally believed that the observed reduction in the Q-factor is due to the loading effect which the first magnetic material has on the inductive component. Since the reduction in the Q-factor has also been found to be controllable by the application of a non-varying magnetic field, it appears reasonable to assume that the loading effect is due to hysteresis losses in the first magnetic material, which losses are coupled to and directly affect the Q of the circuit. Hysteresis losses are associated with changes in the magnetization of the first magnetic material, thus a reduction in any magnetization change would, in turn reduce hysteresis losses and would thereby prevent a reduction in the Q-factor. As noted above, in the present invention, the reduction in any magnetization change is achieved by magnetically biasing the first material with a non-varying magnetic field.

For hysteresis losses to occur, however, it is first necessary that a change in the magnetization of the first magnetic material occur. The greater changes in the magnetization would cause more hysteresis losses and hence a greater reduction in the Q-factor. It would thus be desirable to maximize a controllable magnetization change. One must, therefore, consider how the magnetization of the first magnetic material in the proximity of the LC marker circuit can be caused to change. It will first be recognized that the alternating electromagnetic fields applied in the interrogation zones of EAS system induce electric resonant oscillating currents in the inductive components included in the marker circuit. Further, it is now appreciated both that the oscillating currents produce a corresponding localized oscillating electromagnetic field and that that field can both affect and be affected by magnetic materials in close proximity. This effect is to alter the magnetization state of the first magnetic material, and the effect of the altered magnetization state, and of hysteresis losses associated therewith, is to extract energy from the field,, i.e., to make it appear to be more "lossy", which, effect ultimately becomes apparent as a reduction in the Q-factor.

In contrast, when the first magnetic material is biased in one direction, the localized oscillating field has an insufficient intensity to appreciably alter the magnetic state. Accordingly, hysteresis losses do not extract appreciable energy. The Q-factor is thus substantially unaffected by the presence of the magnetic material and remains in excess of the predetermined value so that the marker is sensitized, e.g., detectable.

Preferably, as noted above, the magnetic biasing means comprises a permanently magnetizable member. Such a member is thought to provide a non-varying external magnetic field in the vicinity of the first magnetic material which is more intense than that provided by the localized alternating electromagnetic field arising from oscillating currents in the inductive component of the marker. Such a unidirectional bias field would effectively saturate the magnetic material and thereby prevent the alternating field from substantially altering the magnetic state of the magnetic material. As the magnetic state is unchanged, hysteresis losses are minimized, and in the absence of such losses, the effective Q-factor remains in excess of the predetermined value. The marker is then sensitized and detectable.

DESCRIPTION OF THE PREFERRED EMBODIMENT

EXAMPLE 1

Figure 1:
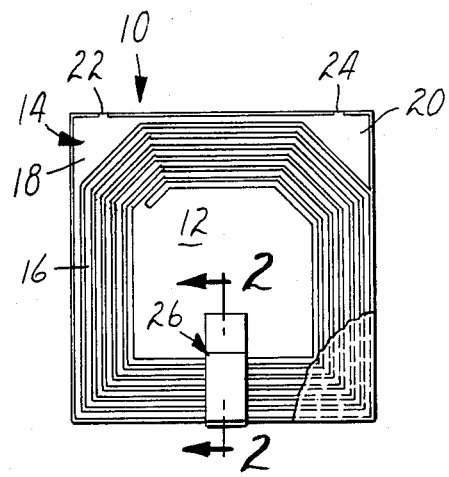
FIG. 1 is a plan view of one embodiment of a marker of the present invention.
Figure 2:
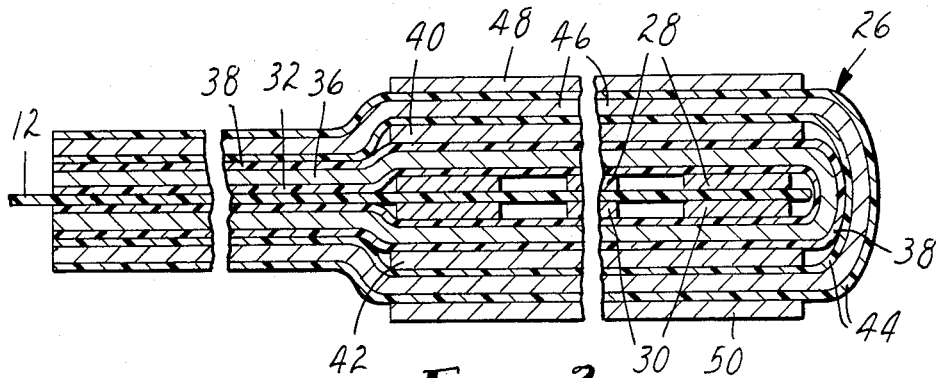
FIG. 2 is a cross-sectional view of the embodiment shown in FIG. 1, when along the lines 2—2.

FIG. 1 sets forth a plane view of one preferred embodiment of the marker of the present invention, a portion of which is shown in the cross sectional view of FIG. 2. The basic marker 10 contains an electrical circuit which includes at least one inductor and one capacitor which in combination resonate at at least one fundamental frequency. Such construction may then be directly used as a marker in an electronic article surveillance system. Although not so shown, the construction may be further modified such as by the addition of outer layers upon which information identifying the user may be printed, or by the addition of a pressure-sensitive adhesive layer to enable the marker to be affixed to the object to be protected.

In the embodiment shown in FIGS. 1 and 2, the basic marker 10 comprises a flexible dielectric sheet 12 to opposite surfaces of which are affixed electrically conductive metal layers, the top most such layer is shown as element 14. The layer 14 is shown to be configured into a number of portions to be further identified but may be seen to be a substantially square multi-turn spiral path forming an inductor 16 and to further have substantially triangular areas 18 and 20 which act as capacitor pads. A like layer (unshown) is affixed to the opposite side of the dielectric sheet 12 such that opposing triangular areas opposite the areas 18 and 20 in concert with the dielectric sheet sandwiched therebetween form discrete capacitors. Such a layer may desirably also include another multi-turn spiral inductor, the respective legs of which are precisely positioned opposite the legs of the inductor 16 and in combination with the dielectric sheet sandwiched therebetween provide additional capacitance in the circuit due to distributed capacitance effects.

The dielectric sheet 12 is preferably a film of a thermoplastic material having desirable dielectric properties, as well as other desirable properties, such as being readily bonded to itself and to the metal layers 14, an outer paper covering, adhesive layers, etc. Polyethylene sheets, for example, 0.023 millimeters thick have been found to be particularly desirable, as such material provides a low dissipation factor, high dielectric strength and may be directly extruded onto a polyester carrier. The exposed face of such a polyethylene sheet is also readily bonded to a metal foil. The marker shown in FIG. 1 is further desirably formed from a preform in which the polyester has affixed to only one side thereof, a metal foil configured into two portions, one being substantially the mirror image of the other. Such a preform may them be folded over, leaving the two portions of the metal layer on the outer surface opposing each other and the inner surfaces of the polyethylene bonded together to provide a dielectric layer twice as thick as the original sheet. If desired, the opposing metal foil layers may be connected via connecting tabs 22 and 24 which extend around the folded over edge.

The conductive layer 14 is preferably formed of a thin-film of a highly conductive metal, such as copper or aluminum, and may be configured utilizing a variety of techniques known to those skilled in the art. Particularly, it is desirable to form the configured pattern via standard printed circuit methods wherein an original stencil pattern is screen printed with an etch resistant ink onto the metal layer and the non-ink coated portions are subsequently etched away. Other analogous techniques known to the art may similarly be utilized.

A construction having the dimensions of approximately 2 inches (5 cm) on each side with the opposing metal foils separated by the double thickness of the polyethylene sheet, hence a distance of approximately 0.046 millimeters, and wherein six turns are provided in each of the spiral portions, each leg having a width of about 1 millimeter and a spacing of about 0.75 millimeters therebetween, has been found to provide a fundamental resonant frequency of approximately 4.5 megahertz.

Of particular importance to the present invention is the addition provided by the element 26 such that reversible deactivation and reactivation of the marker is enabled. The element 26, shown in detail in the cross-sectional view of FIG. 2, includes a multi-layer sandwich construction wrapped around one edge of the marker, thereby partially enclosing the dielectric sheet 12 and the multi-turn inductors, with the ends of the wrap extending toward the center of the marker and beyond the edge of one side of the multi-turn inductors. In the cross-sectional view of FIG. 2, the legs of the inductor 16 may clearly be seen as elements 28, which elements are juxtaposed with like elements 30 of the inductor on the opposite surface of the dielectric sheet 12. Extending symmetrically outward from the legs 28 and 30 of the multi-turn inductors, the element 26 first includes an insulative layer 32 which prevents the respective legs of the inductors from being shorted out by subsequent conductive layers to be described hereinafter. The insulative layer 32 may be formed of any conventional insulative material, such as polyethylene or other polymeric web, kraft paper, or the like, and may also include an adhesive to maintain the layers in position.

Extending outward from the insulative layer 32 is layer 36, formed of a low coercive force, high permeability material such as permalloy or the like. As such materials are also typically conductive, the need for the insulation layer 32 becomes apparent. The high permeability layer 36 is positioned to provide at least one complete magnetic path around the legs 28 and 30 of the multi-turn inductors, with the legs extending through the closed magnetic path. Thus, as shown in FIG. 2, the high permeability layer 36 is wrapped around the outer edge of the inductor legs and extends beyond the edge of the legs toward the inner portion of the marker where the ends of the layer 36 are juxtaposed such that magnetic coupling between the adjacent layers completes the magnetic path.

Extending further outward from the high permeability layer 36, and adhered thereto by pressure sensitive layer 38 are layers 40 and 42 of a relatively high coercive force, permanently magnetizable material to provide a magnetic bias field. Such a material may preferably be vicalloy, high silicon steel, barium ferrite, flexible rubber bonded magnet constructions or the like. A preferred construction includes additional alternating layers of high permeability low-coercive force material. In the embodiment shown in cross-section of FIG. 2, adhered via insulative, adhesive layers 44, additional layer 46 formed of a low coercive force, high permeability material, and 48 and 50 of high coercive force permanently magnetizable material are thus added to improve the efficiency of the closed magnetic path provided by the high permeability material and the magnetic bias provided by the layers of permanently magnetizable material.

As thus constructed, when the layers of permanently magnetizable material 40, 42, 48 and 50 are unmagnetized, such that no magnetic bias field is present, the localized alternating field associated with current induced into the inductors 28 and 30 will reverse the magnetic state of the high permeability low coercive force material 36 and 46. Resultant hysteresis losses then extract energy from the field and lower the effective Q-factor below the predetermined value. The tag is thus deactivated and detection is prevented. Conversely, when the layers 40, 42, 48 and 50 of high coercive force material are magnetized, the layers of high permeability material are subjected to a non-varying, unidirectional bias field more intense than that provided by the localized alternating field. The bias field thus prevents the magnetic states in the low coercive force material from reversing. Accordingly, hysteresis losses do not occur, no reduction in the Q-factor is observed, and the tag is thereby activated and detectable.

The preferred configuration shown in FIGS. 1 and 2 utilizes two wraps of 0.6 mil (15 μm) thick, quarter inch (6.3 mm) wide strips of permalloy, with approximately one quarter of an inch (6.3 mm) extending inwardly of the innermost legs of the inductors thus providing an overlap area of approximately one quarter inch square. When activated by permanently magnetizing the adjacent vicalloy sections the construction was found to be detectable at a distance of over 39 inches from the transmitting antenna in a typical electronic article surveillance system, such as the 3M Model ET 2000 system. In contrast, the same marker design without the deactivating elements is typically detectable at a distance of about 42 inches.

EXAMPELS 2-3

In order to better understand the effects of covering differing amounts of the legs on one edge of the inductors, alternative embodiments of that shown in FIGS. 1 and 2 were constructed wherein the same amount of permalloy present in the two ¼-inch wide layers was used, but wherein that amount of material was provided as a single folded-over layer one-half inch wide (Example 2), or as four folded-over layers, each one-eighth of an inch wide, on top of each other (Example 3). The marker (Example 2) containing the single wrap one half inch wide was found to be detectable at a distance of only approximately 30 inches and the marker having four wraps, one eighth of an inch wide, was detectable at a distance of approximately 41 inches. It may thus be seen that trade-offs can be obtained, with markers having four or more layers providing virtually identical performance as that obtained from a single status marker, however, at the expense of more involved manufacturing procedures than that required when fewer layers are used.

EXAMPLE 4

In an alternative embodiment, the permanently magnetizable strips of vicalloy shown in FIGS. 1 and 2 were replaced with strips of AISI type 301 rolled Stainless steel, 1 mil (25 μm) thick, having the same length as the interleaved strips of permalloy, such that they extend beyond the inner most leg of the inductors and separated the strips of high permeability material extending toward the center of the marker. When the stainless steel sections were permanently magnetized, thereby preventing any change in the magnetic state of the permalloy strips, the marker remained in a sensitized state and was found to be detectable up to 33 inches away from the transmitting antenna when tested as discussed above. When the bias field was made even more intense, such as by providing a section of magnetized barium ferite rubber bonded magnet material adjacent the high permeability sections, a slightly improved result was observed, i.e., that the marker was detectable up to 35 inches away from the lattice, thus suggesting that the stainless steel elements were not as effective as the vicalloy sections discussed in conjunction with FIGS. 1 and 2.

EXAMPLE 5

Figure 3:
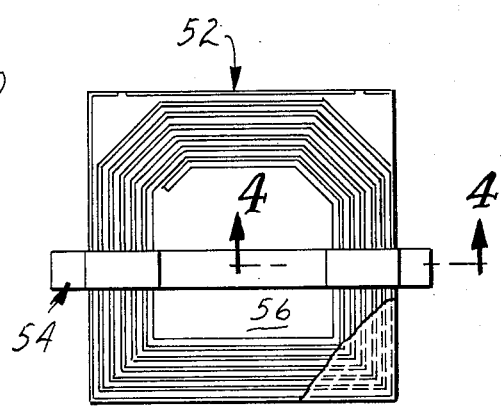
FIG. 3 is a plan view of another embodiment of a marker of the present invention.
Figure 4:
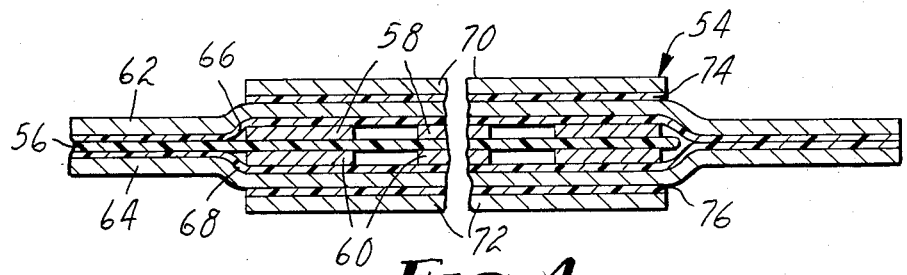
FIG. 4 is a cross-sectional view of the embodiment shown in FIG. 3, taken along the lines 3—3.

In the embodiments discussed hereinabove in conjunction with FIGS. 1 and 2, magnetic members were folded around one edge of the marker and extended beyond the innermost leg of the multi-turn inductors to provide overlapping magnetic members to complete a closed magnetic path. As set forth in FIGS. 3 and 4, a similar construction may result without folding the magnetic members. As may there be seen, such a marker 52 may be constructed from the same folded over and superimposed multi-turn inductors with capacitor pads and distributed capacitance provided by the opposed multi-turn inductors as shown in FIG. 1. The embodiment of FIGS. 3 and 4, however, differs in that the magnetic construction 54 extends across the entire width of the marker, thereby providing two separate closed magnetic paths which enclose opposite legs of the multi-turn inductors. Thus as shown in detail in the cross-sectional view of FIG. 4, in Example 5 the substrate 56 has laminated to opposite surfaces thereof the multi-turn inductors 58 and 60 just as in the previously described embodiment. In this embodiment, however, single ¼-inch (6.3 mm) wide strips 62 and 64 of permalloy are bonded to the opposing surfaces of the multi-turn inductors 58 and 60, separated therefrom by thin insulative layers 66 and 68. In a particularly preferred embodiment, the insulative layers 66 and 68 consist of a two mil (50 μm) thick layers of type 467NBA transfer adhesive manufactured by Minnesota Mining and Manufacturing Company. On the outside of each respective permalloy layer 62 and 64 are positioned layers 70 and 72 of high coercive force, permanently magnetizable material, such as vicalloy, which layers are in turn bonded by transfer adhesive layers 74 and 76. The permalloy layers 62 and 64 extend beyond the outer portion of the substrate 56 and opposing outermost legs of the inductors 58 and 60 such that in the extending portion the permalloy layers are separated only by the insulating layers 66 and 68 and are sufficiently close together to provide a substantially closed magnetic path. Where the permalloy layers extend inwardly beyond the innermost legs of the inductors, the permalloy layers are similarly close together to provide a closed magnetic path in that region.

EXAMPLE 6

Figure 5:
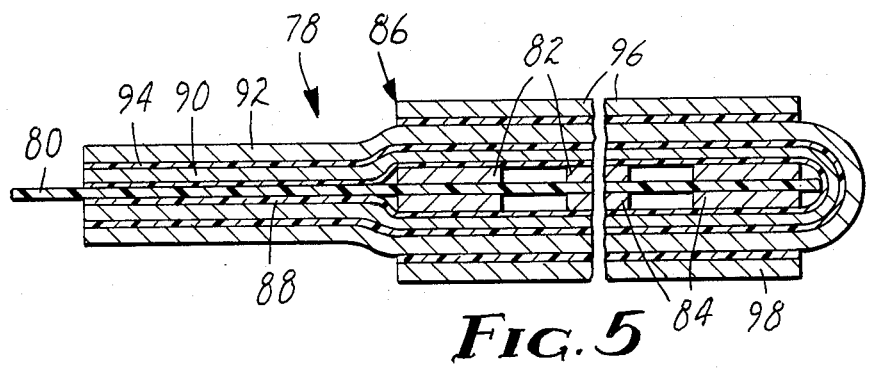
FIGS. 5-7 are further cross-sectional views of other embodiments which in plan view would be the same or similar to those shown in FIGS. 1 and 3, but wherein somewhat different layered constructions are present.

FIG. 5 shows a cross-sectional view of yet another embodiment of the reactivatable marker of the present invention, taken across one edge. The basic marker 78 may be seen to comprise a substrate 80 on opposite sides of which are juxtaposed multi-turn inductors 82 and 84 as described in conjunction with FIGS. 1-4. The magnetic construction 86 which enables alternative activation and deactivation is electrically insulated from the inductors 82 and 84 by means of a thin insulative sheet 88. This embodiment, however, differs from that in Examples 1-4 (FIGS. 1 and 2) in that layers of permalloy 90 and 92 are not separated by layers of high coercive force material. Rather, the permalloy layers are separated from each other only by a thin adhesive layer 94. A given amount of high permeability material of a given thickness is desirably present in order to provide a sufficiently low reluctance magnetic path such that hystersis losses therein will reliably deactivate the marker. If a thinner material is used, less material is required in total. The material is desirably provided in a plurality of thin layers, such as sheets of permalloy, preferably 0.6-1.0 mil (15-25 μm) thick. Finally, in the embodiment shown in FIG. 5, high coercive force, permanently magnetizable, strips 96 and 98 are adhered to opposite surfaces of the outermost permalloy layer 92. While a single layer 96 or 98 is shown on each side, such a layer may similarly be composed of one or more layers of a material, such as vicalloy or the like, in order to provide a unidirectional magnetic field of sufficient intensity to prevent the magnetic state within the permalloy layers from reversing.

EXAMPLE 7

Figure 6:
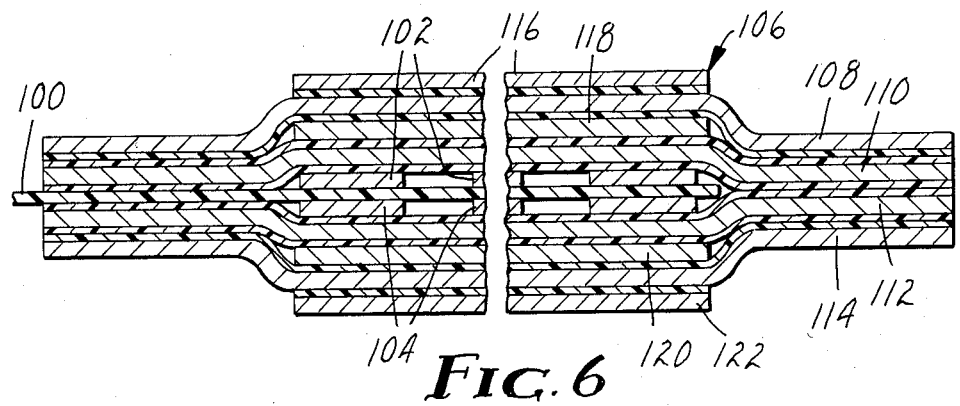

Another alternative embodiment is set forth in the cross-sectional view of FIG. 6 in which the insulating substrate 100 and multi-turn inductors 102 and 104 are the same as in the preceding figures. As there shown, the magnetic structure 106 is affixed to opposite sides of one edge of the marker, and extends beyond the innermost and outermost layers of the inductors to complete the closed magnetic path. Thus as shown in FIG. 6, two layers 108 and 110 of high permeability, low coercive force material are provided on one side of the multi-turn inductor 102 while two additional layers 112 and 114 are provided on the opposite side opposing the multi-turn inductor 104. As before, a thin insulating layer is provided between the inductors and the high permeability layers. Likewise, the entire magnetic construction 106 is bonded together by thin insulating adhesive layers interleaved between the respective high permeability layers 108, 110, 112 and 114 are layers 116, 118, 120 and 122 of a high permeability permanently magnetizable material such as vicalloy. Such a construction has been found to have a performance substantially the same as that of the embodiment shown in FIGS. 1 and 2, but may be preferred in some applications due to the ease of manufacture.

EXAMPLE 8

Figure 7:
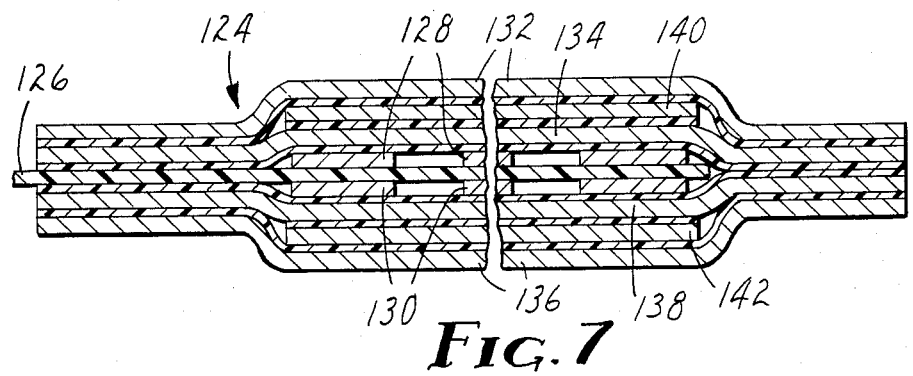

Another alternative marker 124 is shown in FIG. 7 to comprise an insulative substrate 126 having on opposed surfaces thereof a multi-turn inductor 128 and 130 as in the preceding figures. Layers 132 and 134 and 136 and 138 of high permeability material are provided on the outer surfaces of the multi-turn inductors 128 and 130. Interposed between the respective high permeability layers 132 and 134 or 136 and 138 are layers of high coercive force, permanently magnetizable, material 140 and 142. Likewise, the entire marker 124 is bonded together by thin insulating adhesive layers (not shown). This embodiment thus differs from that of Example 7 (FIG. 6) in that only one layer of permanently magnetizable material is provided on each side of the marker.

It may thus be recognized that a number of alternative constructions may be provided, it being relatively immaterial whether the permanently magnetizable sections are only present as the outermost layer as in FIG. 5, are interleaved between opposing layers of the construction as in FIG. 6, or are only provided within the construction as in FIG. 7. The only limitation to the location of the permanently magnetizable material is that it should be located as close to the low coercivity material as practical to provide for an efficient magnetic coupling between the permanently magnetizable material and the low coercivity material.

EXAMPLES 9 AND 10

The embodiments described hereinabove have all been constructed utilizing sheets of permalloy as the high permeability, low coercive force material. Other high permeability materials may similarly be used in the present invention.

In Example 9, the folded-over permalloy layers shown in FIGS. 1 and 2 were replaced with approximately 0.001 inch (25 μm) thick, 3/16" (4.8 mm)×7/16" (1.1 cm) folded over layers of "Silectron" alloy provided by Arnold Engineering. Depending upon the number of layers of such material included, the respective markers were found to be desensitizable to substantially the same degree as with permalloy. Similarly, in Example 10, varying numbers of layers of YEP-HD, a high permeability alloy available from Hitachi Metals Ltd., and having the composition of Fe:12.4%; Mo:2.1%; Nb and Ti:4.2%, balance Ni, were substituted for the permalloy layers. Again, substantially the same degree of sensitivity and desensitizability was observed.

Similarly, the addition of various high coercive force, permanently magnetizable materials, was found satisfactory to enable the thus modified markers to be reactivated upon permanently magnetizing such materials.

EXAMPLES 11-14

Depending upon the Q-factor of the resonant circuit present in the underlying marker, varying amounts of high permeability material may desirably be provided to ensure complete deactivation. In example 11, multi-turn inductors formed of etched copper foil, rather than of aluminum, typically having a very high Q-factor, were found to require more high permeability material to be present in order that hysteresis losses will lower the Q-factor sufficiently to inhibit detection. Such a marker, configured as shown in FIG. 1, but in an unaltered state and evaluated in a system such as that identified above, was found to be detectable 49 inches from the transmitting antenna. The effect of two wraps of one mil permalloy of varying widths wrapped about one edge of such a marker as shown in FIG. 2 was as follows:

| Example | Width of 1 mil permalloy (2 wraps) | Range of Detection (inches) Desensitized (no bias field) | Sensitized (bias field) |
| --- | --- | --- | --- |
| 11 | 0 | 49 | 49 |
| 12 | 3/16 | 5 | 40 |
| 13 | 4/16 | 0 | 45 |
| 14 | 5/16 | 0 | 38 |

It will thus be recognized that if too little high permeability material is present, complete desensitization cannot be obtained, while if too much material is present, the range at which the sensitized marker can be detected is deleteriously affected, without any benefit in the desensitization aspects.

The relative amount of high permeability material, such as permalloy, desirably provided to reliably desensitize a marker may also be evidenced from the following tests with an RF detection system adjusted to provide a less sensitive detection, i.e., to be capable of detecting an unmodified basic marker as in Example 1, forty inches away from the transmitting antenna as opposed to detectability forty-two inches away when the system sensitivity is increased. When such a marker was modified to have a single layer of 3/16 inch wide, one mil strip of permalloy wrapped entirely around one leg of the multi-turn inductor, the modified tag was still detectable in its desensitized state 7½ inches the antenna, thus indicating that an insufficient amount of permalloy was yet present. A still less acceptable configuration resulted when either one or two layers of one mil by 1 inch long strips of 3/16th wide permalloy were provided on only one side of the marker. Such a configuration resulted in the marker still being detectable at distances in the order of 25 inches away from the antenna. In contrast, when such 3/16th inch by one inch pieces were placed on each side of the marker with the edges extending beyond the leg of the inductor in substantial magnetic contact with each other, thus completing a closed magnetic path, the marker was only detectable at about 13 inches away from the antenna. Still more preferred, when two such 3/16th inch by one inch long strips were positioned on each side of the marker, it was only detectable immediately adjacent one corner of the antenna. When still more material was provided, such as by wrapping two layers, 3/16th of an inch wide by 2 inches long, around one edge of the marker thus providing two layers on both sides of the inductor leg, the marker was totally undetectable.

EXAMPLE 15

The high permeability materials such as permalloy used to provide desensitization as in the preceding Examples, may also be replaced by analogous non-crystalline, amorphous materials. In Example 15, the same size strip as used in Example 1, but formed of an amorphous metal, Type 6025, available from Vacuumschmelze GmBH, in an unannealed, as-cast-condition, having a composition of approximately 66 atomic percent cobalt, 40 percent iron, 15 percent silicon, 13 percent boron and 2 percent molybdenum, was observed to be completely undetectable and hence slightly better in performance than the above noted construction of permalloy. Indeed, when only one layer of such a same shape and same material was used, the performance was only marginally worse than that observed for two layers of permalloy. Furthermore, when the amorphous material was annealed, thereby increasing its permeability to enhance its properties for certain applications, but wherein a somewhat higher coercive force resulted, a marker having two such folded over layers of the annealed material was found to be detectable 13 inches away from the transmitting antenna. Similarly, a marker having three such folded over layers was still detectable 10 inches away from the antenna. These results demonstrate that while it is desirable to have a high permeability material, it is perhaps equally important that the material have very low coercive force such that its magnetic state can be readily altered by the low localized fields induced into the marker when present in an interrogation zone.

In further tests of the efficacy of amorphous, low coercive force materials, markers modified with strips of various compositions obtained from Allied Corporation were compared with markers modified with permalloy and the Type 6025 alloy. In Examples 16–18, strips of Type 2826MB2DG (down grain) unannealed (Ex. 16) and strips of 2705MDG (down grain) in the unannealed state (Ex. 17) and CG (cross grain) in an annealed state (Ex. 18) were tested. Under the testing conditions, the unaltered markers were detectable approximately 45 inches away from the transmitting antenna. One layer of all of the various materials, having a constant cross-section of 0.0001875 square inches, (for example, 1 mil thick $\times$ 3/16 inches wide) was simply placed over one edge of the marker, without providing a closed magnetic path. A single layer of permalloy was found to desensitize the marker only to the extent that it could still be detected approximately 12 inches away from the transmitting antenna. The marker having the 6025 type alloy was desensitized to somewhat greater extent, being detectable only approximately 10 inches from the transmitting antenna, and the markers of Example 16–18 were desensitized to a slightly less extent, such tags still being detectable at distances in excess of 2 inches from the transmitting antenna.

When the above materials were provided with a closed magnetic path by providing strips of the same cross-sections but folded over as in Example 1, the permalloy modified marker was still detectable at a distance of 1.75 inches from the transmitting antenna. The marker modified with high cobalt amorphous material (Type 6025) was not detectable under any conditions, the markers modified with the 2705M compositions were still detectable at distances of 5 to 10 inches away from the transmitting antenna, and the marker modified with the 2826MB2 composition was detectable at a distance of 18 inches. When additional amounts of such materials were provided, such as by folding over two or more overlapping strips, the resulting markers were totally desensitized.

As noted above, in a preferred construction of the present invention, the high permeability material is provided in a relatively thin strip, with plurality of such strips being sandwiched together.

For example, two 3/16 inch (0.48 cm) wide strips of permalloy folded over one edge of a marker as in Example 1, each strip being $2.5 \times 10^{-4}$ inches (6.3$\mu$m) thick have been found to be approximately equally effective as four strips of the same length and width, each being $1.25 \times 10^{-4}$ inches (3.17$\mu$m) thick (i.e., the same total thickness of $5 \times 10^{-4}$ inches (12.7$\mu$m) in both cases), both combinations being capable of fully desensitizing a marker. In contrast, two layers each $5 \times 10^{-4}$ inches (12.7 μm) thick and three layers each 10×10⁻⁴ inches (25.4 μm) thick have been found necessary to achieve full desensitization.

As the use of relatively thin sheets of high permeability material are thus desirably used, while at the same time necessarily including sufficient magnetic material to enable full desensitization, it has been determined that such a quantity of material can be provided in a variety of configurations. Thus, for example, such a quantity of material may be provided as one or more strips adjacent each other, extending over a substantial portion of the multi-turn inductor rather than as a laminate. However, the laminated configuration has been found to be preferred. While little difference in the various configurations result from the amount of material necessary to desensitize the marker, when the marker is sensitized by the presence of permanently magnetized material, the resensitized marker formed of laminated narrow strips is detectable at greater distances.

EXAMPLE 19

Figure 8:
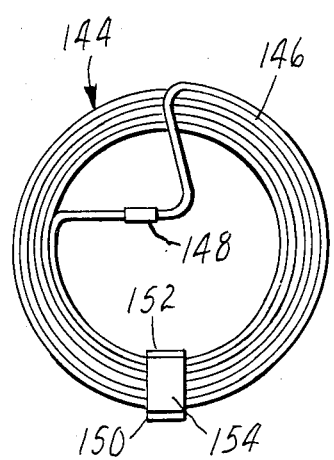
FIG. 8 is a plan view of another embodiment of the marker of the present invention utilizing a discrete capacitor and a multiple turn wire wound inductor.

The present invention, while described hereinabove with regard to a printed circuit type marker, is similarly useful in a variety of other marker configurations. Thus, for example, as shown in FIG. 8, a basic marker 144 may comprise a resonant circuit formed of an inductor 146 formed of a plurality of turns of insulated transformer wire, having secured to opposite ends thereof a capacitor chip 148. The marker 144 may similarly be modified to enable reversible sensitization and desensitization by a magnetic structure 150, as discussed hereinabove. Thus, while in Example 19, one or more complete wraps of a high permeability material 152 between adjacent layers of which are positioned small rectangular sections of a high coercive force permanently magnetizable material 154, were used, the other analogous configurations are also useful.

EXAMPLE 20

Figure 9:
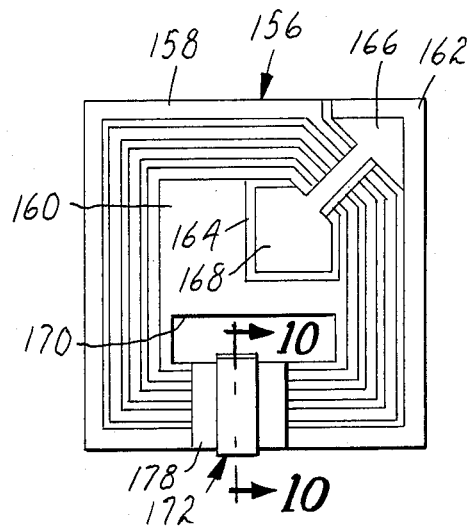
FIG. 9 is a plan view of another embodiment utilizing a printed circuit construction.

In similar fashion, FIG. 9 sets forth a plane view of another configuration of a basic RF marker 156 wherein a printed circuit multi-turn spiral inductor 158 is formed via conventional etching techniques in a conductive sheet applied to one surface of a dielectric substrate 160. In this marker, the multi-turn inductor terminates at relatively large discrete areas 162 and 164. A conductive sheet on the opposite surface of the dielectric sheet 160 is configured with opposing conductive areas 166 and 168 to provide opposing capacitor pads. In the embodiment shown in FIG. 9, the dielectric sheet 160 has been cut away in the area 170 to provide an opening therethrough, allowing the magnetic construction 172 to be wrapped completely around one leg of the multi-turn spiral 158 in the same manner as shown in FIG. 8.

Figure 10:
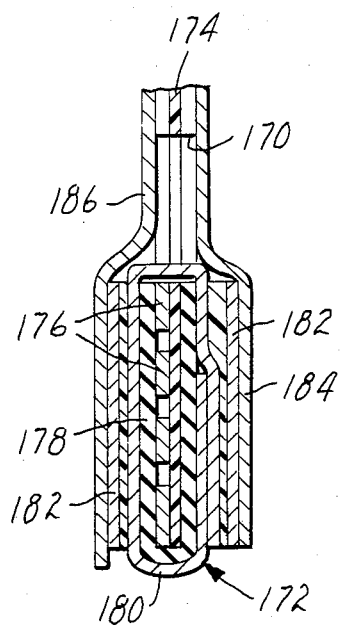
FIG. 10 is a cross-sectional view of the embodiment shown in FIG. 9, taken along the lines 10—10.

A cross-sectional view of the structure 172 is set forth in FIG. 10, where it may be seen that the basic marker construction includes a dielectric substrate 174 having affixed to one surface thereof the multi-turn inductor 176. To prevent the magnetic structure from shorting out the inductor 176, a layer of electrical insulation 178, such as conventional kraft paper or the like, is first wound around the insulator, and the insulation is in turn covered by one or more wraps 180 of high permeability material as described above. Finally, one or more layers of a high coercivity permanently magnetizable material 182 are supplied. The entire construction may be enclosed within a protective outer coating 184, and pressure-sensitive adhesive layers added to enable the marker to be affixed to articles to be protected. The adhesive layers may in turn be temporarily covered with a low adhesive release liner 186.

EXAMPLE 21

Figure 11:
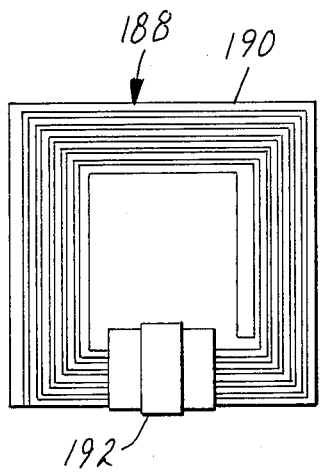
FIG. 11 is a plan view of another embodiment of a marker of the present invention.

Yet another alternative construction is set forth in the plane view of FIG. 11, where the basic marker 188 may be seen to be formed of metal foil spirals on opposite sides of a dielectric sheet, one of which spiral 190 may be seen. Such a configuration may readily be provided by a die-stamping technique as set forth in U.S. Pat. No. 4,482,874. As the portion of the dielectric web on the interior of the multi-turn spirals may be desirably removed during the die-stamping operation, the magnetic structure 192 as discussed may readily be wound about one leg of the multi-turn spiral to provide the alternate sensitization/desensitization capability.

EXAMPLE 22

In addition to the embodiments discussed hereinabove, wherein a single strip of high permeability material is folded or wrapped about all of the turns along one leg of the multi-turn inductor, it is also within the scope of the present invention that each turn of the multi-turn inductor have folded or wrapped about it a separate strip of high permeability material. In such a configuration, a separate strip of high coercive force material may also then be wrapped about each individual strip of high permeability material. Alternatively, a single strip of such high coercive force material may be positioned adjacent to all of the fold or wraps of high permeability material.

Figure 12:
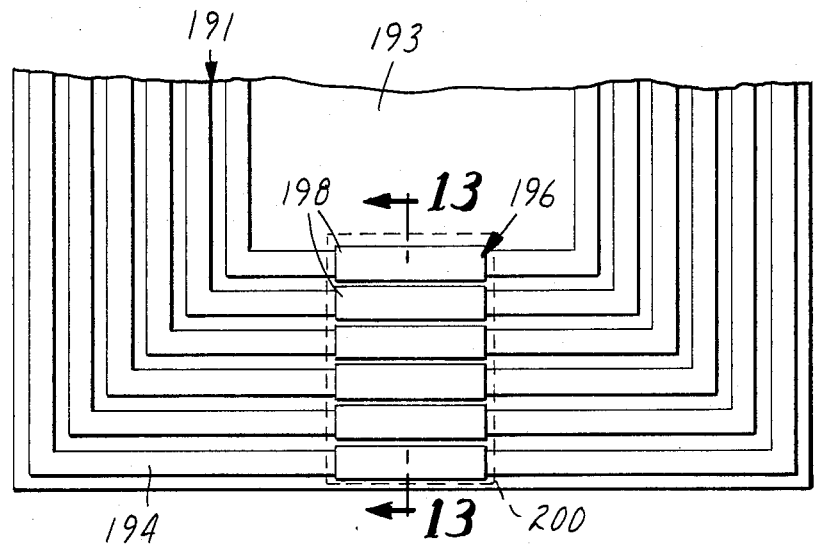
FIG. 12 is a partial plan view of a different embodiment of a marker using individual magnetic pieces over each winding of the inductive component.
Figure 13:
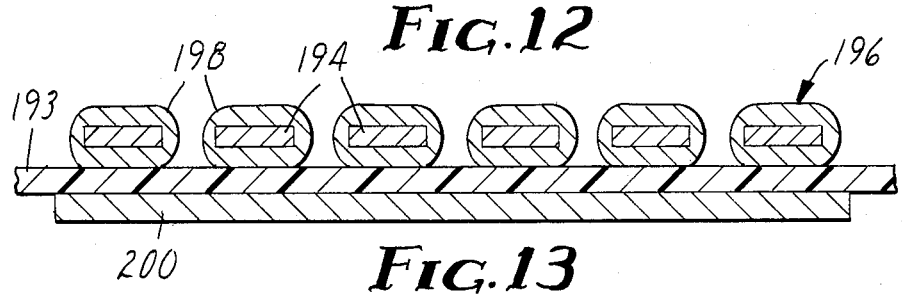
FIG. 13 is a cross-section of the marker shown in FIG. 12 taken along the line 13—13.

In Example 22, set forth in FIGS. 12 and 13, an alternative marker 191 is shown to comprise a dielectric substrate 193 having formed on one surface thereof a multi-turn inductor 194. As shown in more detail in the cross-sectional view of FIG. 13, the marker 191 includes only a single, multi-turn inductor on one side of the dielectric substrate 193, with the remainder of the resonant circuit being formed by a discrete capacitor not shown. The sensitizer/desensitizer assembly 196 may be seen in the cross-sectional view of FIG. 13 to comprise layers 198 of high permeability material which completely surround each turn of the multi-turn inductor 194. On the opposite surface of the dielectric substrate 193 is affixed a single strip of high coercive force material 200. The layers 198 of high permeability material are conveniently provided by successive plating techniques. Such layers may be formed by first providing on a suitable dielectric sheet a first sheet of high permeability material, such as an iron-nickel alloy, having thereover a high conductivity metal layer such as copper or aluminum. The double layer laminated may then be etched to form the multi-turn inductor, with a layer of high permeability material remaining under each conductive strip forming the multiple turns.

Subsequently, a similar high permeability material may be added via vapor deposition, electro-plating or similar techniques to form the top and side portions of the layer 198, thereby completing an enclosed magnetic path.

EXAMPLE 23

Figure 14:
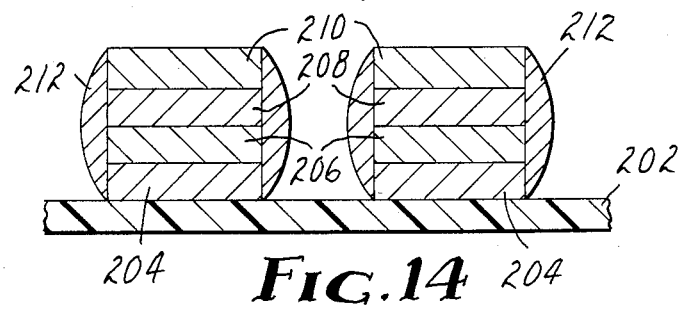
FIG. 14 is a cross-section of a similar embodiment as that shown in FIGS. 12 and 13.

An alternative embodiment to that shown in FIG. 13 is shown in FIG. 14 where a plated assembly is shown to include a dielectric substrate 202 having on a surface thereof the following successive layers: a high permeability material 204, a high conductivity material 206, a second high permeability layer 208 and an uppermost layer 210 of high coercive force material. The multilayer laminate may then be etched using conventional techniques to form a multi-turn spiral thereby removing unwanted portions of all four layers. Subsequently, a completed magnetic path may be provided by plating or vapor depositing high permeability material 212 on both sides of the remaining multi-turn portions.

Figure 15:
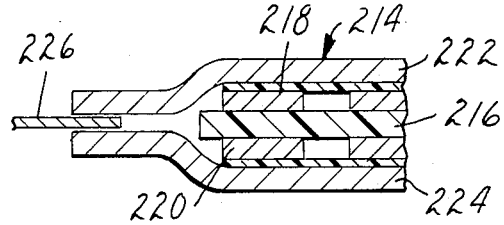
FIG. 15 is a partial cross-section of another embodiment using a removable permanently magnetized element.

It is also within the scope of the present invention that the means for controllably magnetically biasing the high permeability material may be other than a piece of high coercive force permanently magnetizable material which is permanently affixed adjacent the high permeability material. Thus, for example, as shown in the partial cross-sectional view of FIG. 15, a marker 214 may comprise a dielectric substrate 216 having on opposite surfaces thereof opposing multi-turn inductive spirals 218 and 220, with the opposing conductive paths forming a distributed capacitor which completes the resonant circuit. On opposite surfaces of the marker 214 are provided strips 222 and 224 of high permeability material which enclose a portion of one leg of the multi-turn inductors 218 and 220. A portion of the high permeability strips 222 and 224 extends beyond the end of the dielectric substrate 216 so as to be magnetically coupled together to complete a closed magnetic path. However, rather than the layers 222 and 224 being as close together in the overlapping region as possible, the layers are permanently separated to allow a section of high coercive force material 226 to be removably inserted within the gap. Thus, when the marker is sensitized, the permanently magnetized section 226 will be inserted within the gap. The bias magnetic field thereby established prevents alteration in the magnetic states of the high permeability strips 222 and 224 such that no hysteresis loss occurs, no reduction in the Q of the marker occurs and the marker is thereby detectable. Alternatively, when the marker is desensitized, the piece 226 is removed, thereby allowing magnetic coupling between the opposed strips of high permeability material 222 and 224. The closed magnetic path then allows alteration in the magnetic states of those strips 222 and 224, and hysteresis losses reduce the Q of the marker below the point of detectability. It will also be appreciated that a removable magnet for sensitization does not have to have a configuration allowing it to fit into a gap. Such a magnet could be located anywhere where there is room for it in the proximity of the high permeability material such that it saturates that material sufficiently to sensitize the marker.

In an alternative embodiment it has also been found that a desensitizable/sensitizable marker may be provided by providing sections of ferrite materials adjacent at least one leg of the multi-turn inductors. Thus, for example, a thin sheet of low coercivity ferrite sufficiently large to overlap the entire multi-turn inductive spiral has been found sufficient to completely desensitize the marker and may yet be made resensitizable by positioning adjacent thereto a similarly large sheet of a permanent magnetic material such as a rubber-bonded barium ferrite. As such a ferrite is non-conductive, no apparent shielding or deleterious effects on the Q of the circuit was detected. Such a configuration, however, may be less desirable than the embodiments discussed above as a ferrite sheet is more expensive than a similarly sufficient amount of permalloy. A preferred construction wherein ferrites are used, is to utilize two small chips of ferrite on opposite sides of one leg of the multi-turn spiral in a manner more analogous to that provided by the wrap of permalloy. When such a configuration of chips approximately ⅜th of an inch square was utilized, the marker was completely desensitized and was detectable at over 41 inches when sensitized with a section of permanently magnetized rubber-bonded ferrite material positioned adjacent one side of the marker.

Figure 16:
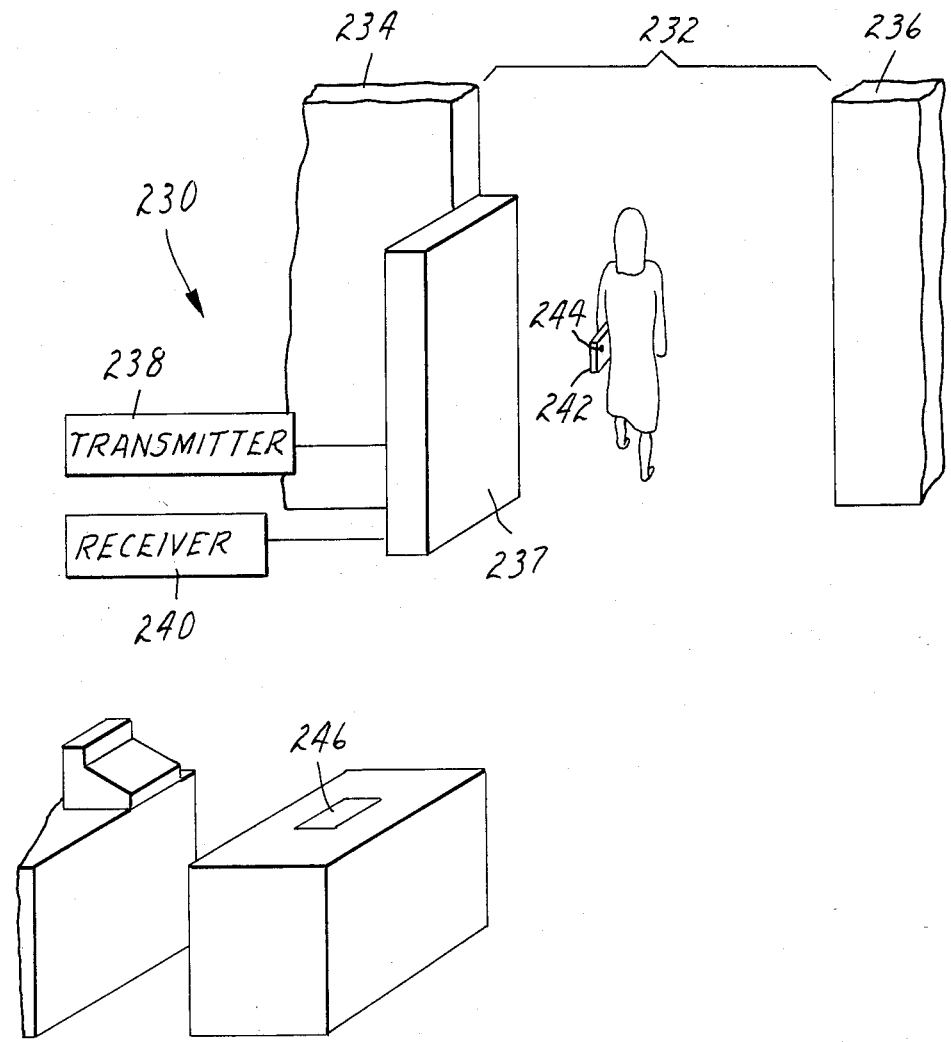
FIG. 16 is a pictorial view of a system using the marker of the present invention.

A three dimensional view of the system of the present invention wherein the desensitizable/sensitizable marker is desirably used, is shown in the perspective view of FIG. 16. As may there be seen, the system 230 is desirably installed to define an interrogation zone 232 such as in an exit-way defined by adjacent walls 234 and 236. Positioned adjacent the wall 234 is an antenna panel 237, within which are positioned transmitting and receiving antennas. The antennas are coupled to a transmitter and receiver circuit 238 and 240, respectively. Such a transmitter circuit 238 will generate electromagnetic signals which are transmitted via the transmitting antenna within the panel 238 to generate a radio frequency field within the interrogation zone 232. Upon passage within the zone of an object 242 to which is affixed a marker 244 according to the present invention, the marker, when in its sensitized state, will be excited to produce oscillations at its resonant frequency. Those oscillations will be detected within the receiver antenna within the receiver panel 237, and the received oscillations coupled to the receiver circuit 240, wherein detector circuitry will distinguish the received signals from other electromagnetic noise and produce an alarm signal when appropriate. A desensitization/sensitization apparatus 246 may be conveniently positioned adjacent the interrogation zone, such as at a checkout counter. The sensitization-desensitization apparatus 246 preferably comprises means for establishing a magnetic field controlled to be either unidirectional or bidirectional. If it is desired to magnetize the permanent magnetic member included within the marker, to thereby sensitize it, a unidirectional field is produced by the apparatus 246. Conversely, if it is desired to desensitize the markers, an alternating magnetic field is produced by the apparatus 246, such that as the marker is gradually removed from the apparatus 246, the permanent magnetizable member of the marker will be exposed to an alternating field of gradually decreasing intensity, such that it ultimately is left in a demagnetized state. Alternatively, as is well known to those skilled in the art, the alternating magnetic field may gradually decrease in intensity, and leave the magnetizable element in a demagnetized condition.

I claim:

1. In an electronic article surveillance system having a receiver for detecting oscillations from a tuned resonant circuit; a resensitizable marker comprising therein, an inductive-capacitive resonant circuit, a first magnetic material, and means for controlling a magnetic circuit formed by said first material, wherein said resonant circuit includes an inductive component having one or more turns, said first magnetic material includes at least one piece of magnetic material of a first type having a low coercive force and high permeability and substantially encloses only a portion of said one or more turns of said inductive component, and said means for controlling the magnetic circuit formed by said material of the first type causes the resonant circuit to alternately be in a first sensitized state and a second, desensitized state.

2. A marker according to claim 1, wherein said resonant circuit exhibits a Q-factor greater than a predetermined value when in a sensitized state and less than said predetermined value when in a desensitized state, and wherein said magnetic circuit controlling means comprises means for alternately establishing a said magnetic circuit having states of low and high efficiency, said high efficiency state being such as to cause sufficient hysteresis losses therein to reduce said Q-factor below said predetermined value such that said marker is in a desensitized state.

3. A marker according to claim 1, wherein the first type of magnetic material is permalloy.

4. A marker according to claim 1, wherein said magnetic circuit controlling means comprises a member formed of a second type of permanently magnetizable magnetic material adjacent said first type of magnetic material.

5. A marker according to claim 4, wherein said second type of magnetic material is vicalloy.

6. A marker according to claim 4, wherein the first type of magnetic material comprises a ferromagnetic material which can be magnetized to saturation by an applied magnetic field not exceeding several oersteds and wherein said second type of magnetic material comprises a material which in a magnetized state exhibits an external magnetic field on the magnetic material of the first type of sufficient intensity to saturate the magnetic material of the first type.

7. A marker according to claim 1, wherein said inductive component comprises at least one loop and said magnetic material of the first type is wrapped around a portion of one or more turns of the loop.

8. A marker according to claim 1, wherein said magnetic material of the first type is folded back on itself so as to only partially encompass a portion of one or more turns of said inductive component.

9. A marker according to claim 1, wherein at least two portions of said magnetic material are positioned on opposite sides of one or more turns of the inductive component and extends beyond said inductive component, the extending portions being positioned opposite to each other so as to be magnetically coupled together to thereby complete said magnetic circuit.

10. A marker according to claim 4, wherein said permanently magnetizable material comprises at least one sheet of such material extending over a significant portion of the magnetic material of the first type.

11. A marker accordding to claim 10, comprising at least two sheets of permanently magnetizable material, one sheet being positioned on each side and adjacent to a section of said magnetic material.

12. A marker according to claim 1, comprising a sheet of a said first type of magnetic material folded back on itself so as to only partially encompass a portion of one or more turns of said inductive component, and further extending therebeyond such that extending portions of said sheet are juxtaposed so as to be magnetically coupled, and further comprising a section of a permanently magnetizable material removably positionable between said extending portions.

13. An electronic article surveillance system comprising (a) means for generating within an interrogation zone a radio frequency electromagnetic field (b) marker means having therein a tuned, inductive-capacitive circuit resonant at a predetermined frequency and having a Q-factor associated therewith in excess of a predetermined value such that when said marker means is in said zone, said circuit responds to said field by absorbing and radiating energy at said frequency and (c) receiver means for receiving energy radiated from said marker means when the effective Q-factor therein is in excess of said predetermined value and for activating an output in response thereto;

wherein said marker means further comprises therein, (i) the resonant circuit having a Q-factor in a sensitized state greater than said predetermined value and a Q-factor in a desensitized state less than said predetermined value, (ii) at least one piece of magnetic material substantially enclosing at least a portion of one or more turns of said inductive component and (iii) means for controlling a magnetic circuit formed by said material to alternately establish a low efficiency and a high efficiency condition in said magnetic circuit, said high efficiency condition being such as to cause sufficient hysteresis losses therein to reduce said Q-factor below said predetermined value such that said marker is then in a desensitized state.

14. A system according to claim 13, wherein said means for controlling the magnetic circuit comprises a permanently magnetizable member adjacent said magnetic material.

15. In an electronic article surveillance system having a receiver for detecting oscillations from a tuned resonant circuit; a resensitizable marker comprising an inductive-capacitive resonant circuit including therein, an inductive component having one or more turns, at least one sheet-like piece of magnetic material of a first type haivng a low coercive force and high permeability and folded back on itself so as to only partially enclose a portion of said one or more turns of said inductive component and further extending therebeyond such that extending portions of said sheets are juxtaposed so as to be magnetically coupled, and means comprising at least a section of permanently magnetizable material removably positionable between said extending portions for controlling the magnetic circuit formed by said material of the first type to thereby cause the resonant circuit to alternately be in a first sensitized state and a second, desensitized state.

16. In an electronic article surveillance system having a receiver for detecting oscillations from a tuned resonant circuit, a resensitizable marker comprising an inductive-capacitive resonant circuit including therein, an inductive component having one or more turns, at least one piece of magnetic material of a first type having a low coercive force and high permeability and substantially enclosing only a portion of said one or more turns of said inductive component, and means comprising a member formed of a second type of permanently magnetizable magnetic material extending over a significant portion of said first type of magnetic material for controlling the magnetic circuit formed by said material of the first type to thereby cause the resonant circuit to alternately be in a first sensitized state and a second, desensitized state.

* * * * *